US006862221B1

(12) United States Patent
Melik-Martirosian et al.

(10) Patent No.: US 6,862,221 B1
(45) Date of Patent: Mar. 1, 2005

(54) MEMORY DEVICE HAVING A THIN TOP DIELECTRIC AND METHOD OF ERASING SAME

(75) Inventors: Ashot Melik-Martirosian, Santa Clara, CA (US); Mark W. Randolph, San Jose, CA (US); Sameer S. Haddad, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/459,102

(22) Filed: Jun. 11, 2003

(51) Int. Cl.$^7$ .............................................. G11C 16/04
(52) U.S. Cl. .......................... 365/185.29; 365/185.18; 365/185.28
(58) Field of Search ................. 365/185.18, 185.28, 365/185.29, 185.03, 185.33, 189.04

(56) References Cited

U.S. PATENT DOCUMENTS

| | | | | |
|---|---|---|---|---|
| 3,992,701 A | * | 11/1976 | Abbas et al. | 365/184 |
| 6,011,725 A | * | 1/2000 | Eitan | 365/185.33 |
| 6,215,702 B1 | * | 4/2001 | Derhacobian et al. | 365/185.29 |
| 6,434,053 B1 | * | 8/2002 | Fujiwara | 365/185.28 |

* cited by examiner

Primary Examiner—Gene N. Auduong
(74) Attorney, Agent, or Firm—Renner, Otto, Boisselle & Sklar, LLP

(57) ABSTRACT

A non-volatile memory device includes a semiconductor substrate and a source and drain within the substrate. A dielectric stack is formed over the substrate. The dielectric stack includes a thin top dielectric layer. A gate electrode is formed over the dielectric stack. The memory device is operative to perform a direct tunneling channel erase operation in which a pair of charge storing cells within a charge storing layer are erased via direct tunneling through the thin top dielectric layer.

16 Claims, 2 Drawing Sheets

MEMORY DEVICE HAVING A THIN TOP DIELECTRIC AND METHOD OF ERASING SAME

TECHNICAL FIELD

The present invention relates generally to the field of non-volatile memory devices and, more particularly, to a charge trapping dielectric flash electrically erasable and programmable memory device having a thin top dielectric layer and an improved erase method.

BACKGROUND

A pervasive trend in modern integrated circuit manufacture is to increase the amount of data stored per unit area on an integrated memory unit, such as a flash memory unit. Memory units often include a relatively large number of core memory devices (sometimes referred to as core memory cells). For instance, a conventional dual cell memory device, such as a charge trapping dielectric flash memory device, is capable of storing two bits of data in a double-bit arrangement. That is, one bit can be stored using a first charge storing region on a first "side" of the memory device and a second bit can be stored using a second charge storing region on a second "side" of the memory device.

As shown in FIG. 2, in a conventional charge trapping dielectric flash memory device 10, the charge storing regions 36, 38 are part of a non-conductive charge trapping layer 28 that is disposed between a relatively thick (e.g., about 100 angstroms (Å)) bottom (or tunnel) dielectric layer 26 and a relatively thick (e.g., 100 angstroms (Å)) top dielectric layer 30. This dielectric stack can be formed over a P-type conductivity silicon substrate 12 having a series of bitlines $BL_1$, $BL_2$ disposed therein. A series of conductive wordlines WL made from polycrystalline silicon is formed over the dielectric stack for serving as a gate electrode 32 for each memory device. The core memory devices 10 can be addressed by applying appropriate voltages to the wordline WL and/or bitlines $BL_1$, $BL_2$. During programming and reading of the core memory devices 10, the bitlines $BL_1$, $BL_2$ can function as a source 14 (i.e., a source of electrons or holes) and a drain 16 with an active channel region defined therebetween.

Programming of such a memory device 10 can be accomplished, for example, by hot electron injection. Hot electron injection involves applying appropriate voltage potentials to each of the gate electrode 32, the source 14, and the drain 16 of the memory device 10 for a specified duration until the charge trapping layer 28 accumulates charge.

A conventional charge trapping dielectric flash memory device 10 can be erased using the conventional technique of "hot hole injection" (sometimes referred to as band-to-band (BTB) hot hole injection). In a hot hole injection erase, a negative gate 32 voltage (e.g., about −4 Volts to about −8 Volts) is applied along with a drain 16 voltage on the order of about 4.5 Volts to about 6.0 Volts, while the source is floated or grounded to erase one of the memory cells (typically the normal bit 36). Conversely, the complementary bit cell 38 is erased by floating the drain and applying the appropriate voltages to the source 14 and the gate 32.

As shown in FIG. 2, with such erase conditions, a BTB tunnel current is created under the gate. Holes 22 are generated under these conditions and accelerate from the N-type drain 16 region into the P-type body 18. The generated holes 22 are accelerated in the electrical field created near the P-N drain/body junction. Some of the accelerated holes 22 surmount the bottom dielectric to silicon interface between the substrate 12 and the bottom dielectric layer 26 and are injected into the charge trapping layer 28 to displace electrons (e.g., by recombination) and erase the cell. However, as these hot holes bombard the interface between the substrate 12 and the bottom tunnel dielectric 26, the interface as well as the bottom tunnel dielectric are damaged, causing undesirable interface states, degraded reliability over program/erase cycling, and diminished data retention capability.

Accordingly, there is an ever increasing demand for a charge trapping dielectric flash memory device, which can be erased effectively, while more effectively maintaining data retention capability.

SUMMARY OF THE INVENTION

According to one aspect of the invention, the invention is directed to a memory device. The memory device can include a semiconductor substrate and a source and a drain formed from buried bitlines disposed within the semiconductor substrate. The source and drain can define a body region therebetween. A bottom dielectric layer, of a certain thickness, can be formed over the semiconductor substrate. A charge storing layer can be formed over the bottom dielectric layer. The charge storing layer can have a conductivity such that at least a first charge can be stored in a first charge storing cell adjacent the drain and at least a second charge can be stored in a second charge storing cell adjacent the source. A top dielectric layer, which has a thickness less than the thickness of the bottom dielectric layer, can be formed over the charge storing layer. A gate electrode can be formed over the top dielectric layer.

According to another aspect of the invention, the invention is directed to a method of performing an erase operation on a non-volatile memory device. The memory device can include a source and a drain within a substrate. A bottom dielectric layer can be formed over a top surface of the substrate. A charge storing dielectric layer can be formed over the bottom dielectric layer. A top dielectric layer can be formed over the charge storing dielectric layer and a gate electrode can be formed over the top dielectric layer. The memory device can be programmed by storing charge in a portion of the charge storing dielectric layer adjacent the drain. The method can include applying a positive erase voltage to the gate electrode. The method can further include either (i) connecting the drain to a zero potential or (ii) connecting the drain to a negative potential, and either (i) connecting the source to a zero potential or (ii) connecting the source to a negative potential.

According to another aspect of the invention, the invention is directed to a method of simultaneously erasing two charge storing cells on a non-volatile memory device. The memory device can include a pair of bitlines within a substrate and a charge trapping dielectric stack on a top surface of the substrate. The charge trapping dielectric stack can include a bottom dielectric layer, a charge storing dielectric layer and a top dielectric layer. The charge storing cells can be disposed within the charge storing layer of the charge trapping dielectric stack. A gate layer can be disposed on the charge storing dielectric stack. The method can include decreasing the thickness of the top dielectric layer of the dielectric stack, where the decreased thickness is effective to increase the probability that, during an erase operation, electrons within the charge storing cells of the charge storing layer will tunnel through the top dielectric layer to exit the charge storing cells. The method can further include applying a positive gate erase voltage of less than about +10 Volts to the gate layer. The method can further include either (i) applying a zero potential to a first bitline or (ii) applying a potential of about −4 Volts to about −5 Volts to the first bitline, and either (i) applying a zero potential to a second bitline or (ii) applying a potential of about −4 Volts to about −5 Volts to the second bitline.

BRIEF DESCRIPTION OF DRAWINGS

These and further features of the present invention will be apparent with reference to the following description and drawings, wherein.

DISCLOSURE OF INVENTION

Figure 1:
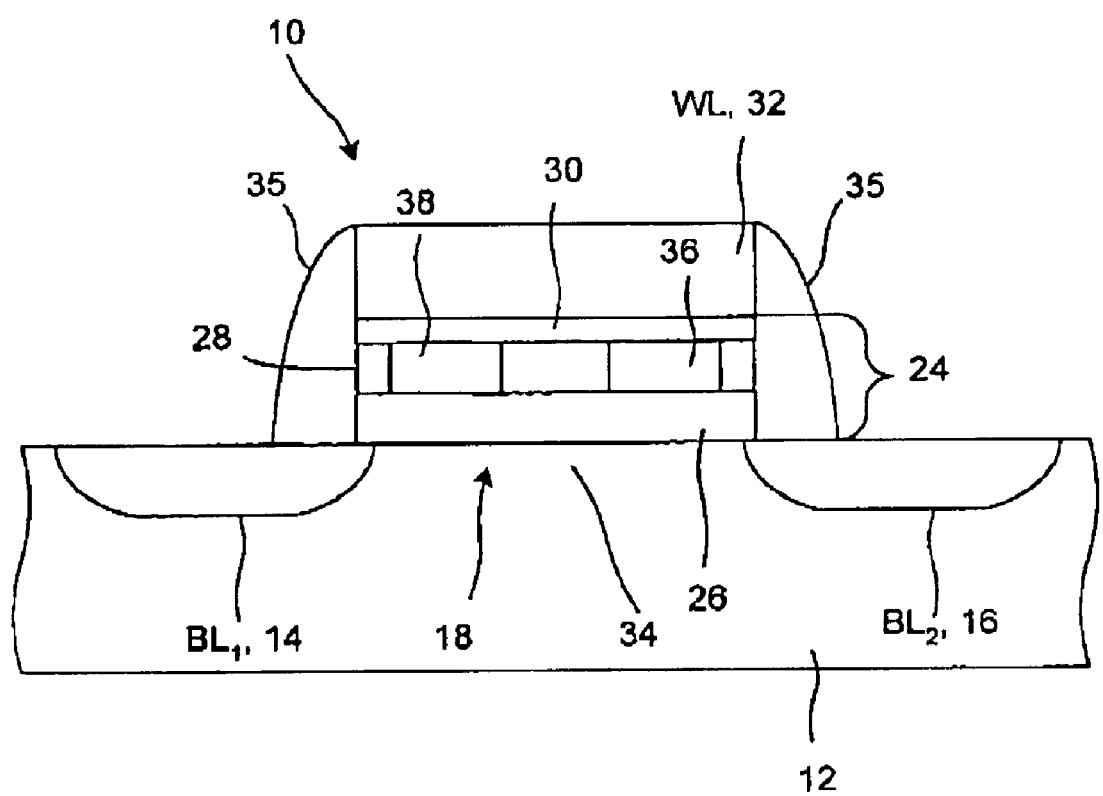
FIG. 1 is a schematic cross-section illustration of a flash memory device in accordance with the present invention.
Figure 2:
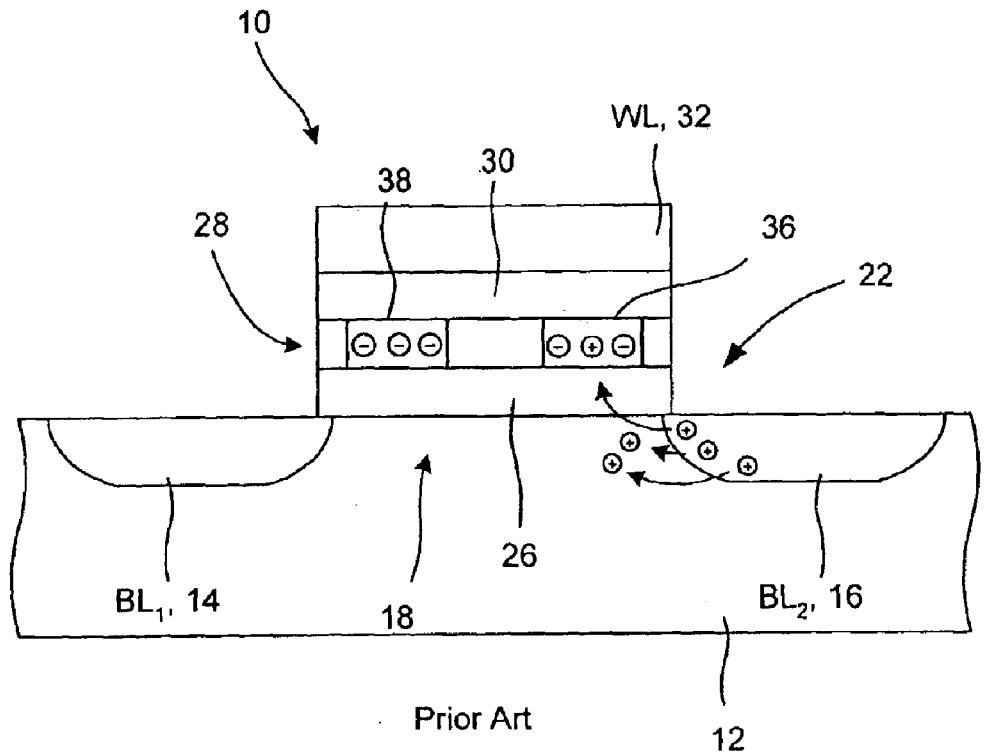
FIG. 2 illustrates the flow of hot holes from the drain to the charge trapping layer of a conventional memory device during a typical hot hole injection erase operation.

In the detailed description that follows, like components have been given the same reference numerals regardless of whether they are shown in different embodiments of the present invention. To illustrate the present invention in a clear and concise manner, the drawings may not necessarily be to scale and certain features may be shown in somewhat schematic form.

With reference to FIG. 1, an exemplary multiple-bit, charge trapping dielectric, non-volatile, flash electrically erasable and programmable memory device 10 is illustrated. The memory device 10 includes a semiconductor substrate 12. In one embodiment, the substrate 12 can initially be doped to have P-type conductivity (i.e., P dopant concentration). Within the substrate 12, a pair of buried bitlines $BL_1$, $BL_2$ are formed. Each buried bitline $BL_1$, $BL_2$ can be doped to have an N-type conductivity (e.g., $N^+$ dopant concentration). In one embodiment, each buried bitline $BL_1$, $BL_2$ functions as a source 14 and a drain 16, respectively, during various programming, reading, and erasing operations. Alternatively, the source 14 and the drain 16 can be coupled to corresponding bitlines.

A body 18 is formed between the source 14 and the drain 16. The body 18 can have the dopant type and concentration as the initial doping of the substrate 12. The substrate 12, the source 14, the drain 16 and the body 18 can be formed, for example, from a semiconductor such as appropriately doped silicon, germanium or silicon-germanium.

Above the body 18 is a dielectric stack 24. The dielectric stack 24 includes a dielectric layer 26 (also referred to as a tunneling dielectric layer or a bottom dielectric layer) that is made from, for example, silicon oxide ($SiO_2$), other standard-K material (e.g., having a relative permittivity below ten) or a high-K material (e.g., having a relative permittivity, in one embodiment above ten, and in another embodiment above twenty).

Over the bottom dielectric layer 26 is a charge trapping layer 28 (also referred to as a charge storing layer). The charge storing layer 28 can be made from, for example, a non-conductive material, including silicon nitride ($Si_3N_4$), silicon oxide with buried polysilicon islands, implanted oxide and the like.

Over the charge storing layer 28 is another dielectric layer 30 (also referred to as a top dielectric layer) made from a material such as, for example, silicon oxide ($SiO_2$), other standard-K material or a high-K material.

Over the top dielectric layer 30 a wordline WL is formed. In one embodiment, the wordline WL functions as a gate electrode 32 which, in part, controls a channel 34 interposed between the bitlines $BL_1$, $BL_2$. In alternative arrangements, the wordline WL can be formed from interconnected polysilicon gate electrode 32 islands or pads. A work function of the gate electrode 32 and dielectric stack 24 controls the channel 34 (e.g., inversion or depletion states) within the body. The wordline WL and/or gate electrode 32 can be made from, for example, polycrystalline silicon ("poly") or another appropriate material, such as a metal or metal oxide. Sidewall spacers 35 can be disposed adjacent lateral sidewalls of the gate electrode 32 and dielectric stack 24 for use in controlling dopant implantation, device properties, and the like.

In one embodiment, the top dielectric layer 30 has a thickness that is less than the thickness of the bottom dielectric layer 26. For example, in one embodiment, the top dielectric layer 30 can have a thickness of about 25 angstroms (Å) to about 50 angstroms (Å), while the bottom dielectric layer 26 can have a thickness of about 50 angstroms (Å) to about 80 angstroms (Å). It is noted that this embodiment provides a dielectric stack 24 having a reduced total thickness (e.g, about 130 angstroms (Å) to about 190 angstroms (Å), assuming a thickness of about 55 angstroms (Å) for the charge trapping layer 28), which provides numerous advantages, including, but not limited to greater scalability, improved operating speed, and reduced operating voltage. The reduced total thickness of the dielectric stack 24 improves gate control over the channel 34, which, in turn, results in higher programming efficiency and speed at a reduced gate and drain operating voltages.

As is described more fully below, the reduced thickness of the top dielectric layer 30 facilitates a direct tunneling top dielectric erase, which results in significant operational and data retention advantages over the conventional hot hole injected erase. It is noted that, in one embodiment, while the thickness of the bottom dielectric layer 26 is reduced, it remains thick enough to prevent low voltage leakage current and facilitate desirable data retention.

The memory device 10 is operatively arranged to be programmed, verified, read, and erased by the application of appropriate voltage potentials to each of the wordline WL, which functions as the gate electrode 32, and the buried bitlines $BL_1$, $BL_2$, which each function as the source 14 or the drain 16 depending upon the desired operation.

In one embodiment, the memory device 10 can be configured as virtual ground device. That is, during various operations of the memory device 10, either of the first bitline $BL_1$ or the second bitline $BL_2$ can function as a source 14 of electrons and either of the first bitline $BL_1$ or the second bitline $BL_2$ can be grounded or connected to a bias potential through bitline contacts (not shown).

As will become more apparent from the discussion below, within the charge storing layer 28, the memory device 10 includes a first charge trapping region or cell 36 (also referred to herein as a normal cell, a first charge storing cell or normal bit) adjacent one of the conductive regions (e.g., the bitline $BL_2$, which can function as the drain 16) and a second charge trapping region or cell 38 (also referred to herein as a complementary cell, a second charge storing cell or complementary bit) adjacent the other conductive region (e.g., the bitline $BL_1$, which can function as the source 14).

Each charge storing cell 36, 38 can independently have two data states. The data states can represent binary values, such as a logical zero and a logical one. The logical one, for example, can be implemented by leaving the desired charge storing cell 36, 38 in an unprogrammed state or blank programmed level. The logical zero, for example, can be implemented by storing an amount of charge in the desired charge storing cell 36, 38. This condition is also referred to as a charged state, a programmed state, a programmed level or a charged program level.

In the illustrated embodiment, the memory device 10 is a structurally symmetrical device, allowing for programming, verifying, reading, and erasing of the first charge storing cell 36 and the second charge storing cell 38 by respectively switching the roles of the bitlines $BL_1$, $BL_2$ (the source 14 and the drain 16) during those operations. Therefore, the bitlines $BL_1$, $BL_2$ will be referred to interchangeably by the terms source and drain, depending upon which of the normal bit 36 or the complementary bit 38 is being programmed, verified, read, or erased.

In one embodiment, the programming technique involves hot electron injection, also referred to as channel hot electron injection (CHE). However, it should be appreciated that modifications to the programming techniques can be made to accommodate variations in the specific memory device used.

Using hot electron injection, the first charge storing cell 36 can be programmed by applying a voltage potential (e.g., about +3 Volts to about +5 Volts) to the bitline $BL_2$ (functioning as the drain 16) and a voltage potential (e.g., in one embodiment, about +8 Volts to about +10 Volts, in another embodiment having a reduced thickness dielectric stack 24, less than about +8 Volts) to the wordline WL (functioning as the gate electrode 32). The other bitline $BL_1$ functions as the source 14 (i.e., source of electrons) for the CHE programming of the first charge storing cell 36. In one embodiment, a bias voltage potential is also applied to the source 14 (rather than grounding the source as found in conventional charge trapping dielectric flash memory devices). As a result of the application of a bias potential to the source 14 during programming, greater control over electron injection can be accomplished, which leads to enhanced data retention capability of the memory device 10.

The voltages applied to the gate electrode 32, the source 14 and the drain 16 generate a vertical electric field through the dielectric layers 26, 30 and the charge storing layer 28 and a lateral electric field along the length of the channel 34 from the source 14 to the drain 16. At a given threshold voltage, the channel 34 inverts such that electrons are drawn off the source 14 and begin accelerating towards the drain 16. As the electrons move along the length of the channel 34, the electrons gain energy and, upon attaining enough energy, the electrons jump over the potential barrier of the bottom dielectric layer 26 and into the charge storing layer 28, where the electrons become trapped.

The probability of electrons jumping the potential barrier is a maximum in the area of the first charge storing cell 36, adjacent the drain 16 (i.e., bitline $BL_2$), where the electrons have gained the most energy. These accelerated electrons are termed hot electrons and, once injected into the charge storing layer, stay in the first charge storing cell 36 of the charge storing layer 28 (see, for example, FIG. 3). The trapped electrons tend not to spread laterally through the charge storing layer 28 due to its low conductivity and low lateral electric field therein. Thus, the trapped charge remains localized in the charge trapping region of the first charge storing cell 36 close to the adjacent bitline $BL_2$.

The foregoing technique to program the first charge storing cell 36 can be used to program the second charge storing cell 38, but the functions of the bitlines $BL_1$ and $BL_2$ (i.e., source 14 and the drain 16) are reversed.

Figure 3:
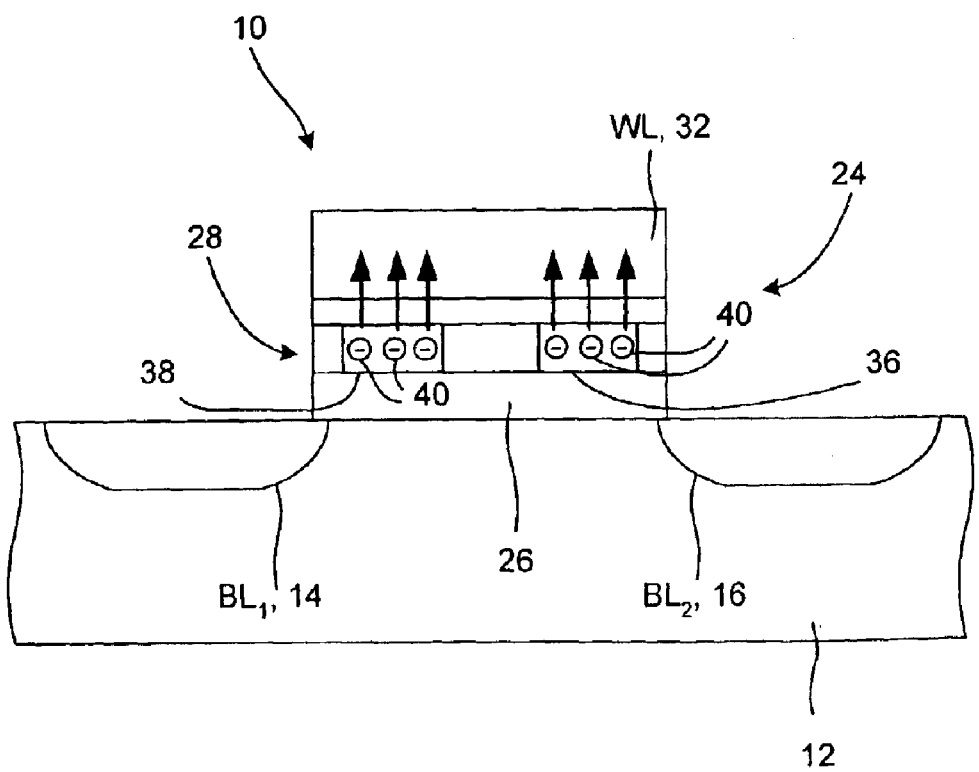
FIG. 3 is a schematic cross-section illustration of the flash memory device of FIG. 1 illustrating the flow of electrons through a top dielectric layer during an erase operation in accordance with the present invention.

With reference now to FIG. 3, once one or both of the charge storing cells 36, 38 are programmed with stored charge 40 using, for example, the CHE technique described above, one or both of the charge storing cells 36, 38 can be erased using a direct tunneling top dielectric channel erase operation. As is described above, this direct tunneling top dielectric channel erase operation is possible because of the structural features of the memory device. For example, the use of a reduced thickness top dielectric layer 30 (e.g., about 25 angstroms (Å) to about 50 angstroms (Å)) greatly facilitates direct tunneling across the top dielectric layer 30 upon the application of appropriate erase voltage potentials.

In one embodiment, both charge storing cells can be erased simultaneously by applying a positive gate erase voltage of about +10 Volts to about +15 Volts to the wordline WL (i.e., gate electrode 32) and grounding both bitlines $BL_1$ and $BL_2$ (i.e., the source 14 and the drain 16).

In an alternative embodiment, positive potential of about +4 Volts to about +5 Volts can be applied to the wordline WL, while negative voltage potentials of about −4 Volts to about −5 Volts are applied to the bitlines $BL_1$ and $BL_2$. It is noted, that each of the above erase operations can provide a direct tunneling erase of both charge storing cells 36, 38 through the top dielectric layer 30 (along the direction of the arrows in FIG. 3) due to the reduced thickness of the top dielectric layer 30.

Alternatively, a tailored erase operation (i.e., individual selective erasing of at least one of the charge storing cells 36, 38) can be achieved. For example, in one embodiment, the first charge storing cell 36 can be erased by applying a positive gate erase voltage (e.g., about +4 Volts to about +5 Volts) to the wordline WL, applying a negative voltage of about +4 Volts to about −6 Volts to $BL_2$, and grounding bitline $BL_1$ (i.e., the source 14). Conversely, the second charge storing cell 38 can be erased by applying a positive gate erase voltage (e.g., about +4 Volts to about +5 Volts) to the wordline WL, applying a negative voltage of about −4 Volts to about −6 Volts to $BL_1$, and grounding bitline $BL_2$ (i.e., the drain 16). It is to be appreciated that other erase voltage combinations may be employed without departing from the scope of the present invention.

It is worth noting, that the decreased thickness of the top and bottom dielectric layers allows for reduced erase and program voltages. Furthermore, use of the direct tunneling erase through top dielectric reduces the stress on the bottom dielectric, since the bottom dielectric is stressed only during the program operation. This allows one to reduce the thickness of the bottom dielectric without compromising the retention properties of the cell.

Referring back to FIG. 1, one method of fabricating the memory device 10 will be described in greater detail. The method can begin by providing the semiconductor substrate 12. The semiconductor substrate 12 can be initially doped with P-type dopant (e.g., by implanting boron ions, gallium ions or indium ions). As indicated above, the initial substrate 12 doping can provide the desired conductivity for the body 18.

A layer of material used to form the bottom dielectric layer 26 can be grown or deposited on top of the substrate 12. In one embodiment, the bottom dielectric layer 26 can have a reduced final thickness of about 50 angstroms (Å) to about 80 angstroms (Å). As indicated above, since the bottom dielectric layer 26 is stressed only during program operation, the thickness of the bottom dielectric layer 26 remains thick enough to prevent low voltage leakage current and provide desirable data retention. It is noted that the bottom dielectric layer 26 can optionally be used as an implant screen during the implantation of dopant species into the substrate 12. In this instance, the bottom dielectric layer 26 can be formed before initial substrate 12 implantation.

As indicated above, the bottom dielectric layer 26 can be formed from an appropriate dielectric material, such as silicon oxide (e.g., $SiO_2$) or a high-K material. High-K materials are materials having, in one embodiment, a relative permittivity of ten or higher and, in another embodiment, of twenty or higher. Although other high-K materials can be selected, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$), and barium strontium titanate (BST) are suitable high-K materials. In addition, all binary and ternary metal oxides and ferroelectric materials having a K higher than, in one embodiment, about twenty can be used for the bottom dielectric layer 26.

Following formation of the bottom dielectric layer 26, a layer of material used to form the charge storing layer 28 can be formed on the bottom dielectric layer 26. In one embodiment, the charge storing layer 28 can be formed from silicon nitride ($Si_3N_4$). Other suitable dielectric materials may also be used for the charge storing layer 28. The charge storing layer 28 can have a final thickness of about 50 angstroms (Å) to about 80 angstroms (Å).

On top of the charge storing layer 28, the top dielectric layer 30 can be formed. Similar to the bottom dielectric layer 26, the top dielectric layer 30 can be made from an appropriate dielectric, such as silicon oxide (e.g., $SiO_2$) or a suitable high-K material. High-K materials are materials having, in one embodiment, a relative permittivity of ten or higher and, in another embodiment, of twenty or higher. However, the top dielectric layer 30 is thinner (e.g., having a final thickness of, about 25 angstroms (Å) to about 50 angstroms (Å)) than the bottom dielectric layer 26.

On top of the top dielectric layer 30, a gate electrode layer 32 can be formed. The gate electrode layer 32 can be made from, for example, polycrystalline silicon ("poly") or another appropriate material such as a metal or metal oxide. In one embodiment, the gate electrode layer 32 can have a thickness of about 500 angstroms (Å) to about 3,000 angstroms (Å).

The tunnel dielectric layer 26, the charge storing layer 28, the top dielectric layer 30, and, optionally, the gate electrode layer 32 can be uniformly formed across the substrate in an area used to form a core array of memory devices 10. After the layers 26, 28, 30, and 32 have been formed, these layers can be patterned to form stacked gates. The patterning step can also be referred to as a bitline mask and etch step. A mask layer can be formed from, for example, a photoresist that is patterned using photolithographic techniques. The mask layer can be patterned into a series of lines and spaces where the lines cover the layers 26, 28, 30, and 32 where the stacked gates are formed and the spaces expose the layers 26, 28, 30, and 32 where the bitlines $BL_1$, $BL_2$ will be formed.

The layers 26, 28, 30, and 32 can be etched in areas left exposed by the mask layer to expose the substrate 12. In an alternative embodiment, the bottom dielectric layer is left in place as an implant screen.

Once the patterning and/or etching process is complete, an ion or dopant implantation process is carried out to form the buried bitlines $BL_1$, $BL_2$. In one embodiment, the buried bitlines are formed by the dopant implantation of an N-type dopant species (e.g., ions such as antimony, phosphorous or arsenic). It is to be appreciated that the stacked gate can function as a self-aligned mask for the dopant implantation.

In one embodiment, the buried bitlines are formed with sufficient N-type dopant implanted to provide $N^+$ conductivity. For example, in one embodiment, arsenic ion species can be implanted with a energy of about 40 keV to about 50 keV and a dose of about $1\ e^{15}$ atoms/cm$^2$ to about $2e^{15}$ atoms/cm$^2$. If desired, an anneal cycle (such as a rapid thermal anneal (RTA)) can be carried out to activate the dopant species of the buried bitlines $BL_1$, $BL_2$. The ion implantation energy can be of sufficient magnitude that the buried bitlines have a depth of at least 100 angstroms (Å). It is noted that the dopant species may diffuse under the stacked gate during one or more subsequent anneal cycles to which the memory device 10 is subjected. Any such diffusion can be accounted for or otherwise controlled by controlling the implant energy, the implant dose, the anneal cycle parameters, pre-amorphization parameters and the like.

Sidewall spacers 35, if applicable, can be formed. The sidewall spacers 35 can be formed adjacent the lateral sidewalls of the stacked gate using a variety of techniques. For example, a layer of desired spacer material (e.g., silicon nitride, silicon oxide, silicon oxynitride, etc.) can be deposited to at least the height of the stacked gate 36. If desired, the spacer material can be polished (using, for example, chemical mechanical planarization or CMP) back to an upper surface of the gate electrode 32. Then, the spacer material can be anisotropically etched so that the sidewall spacers 35 remain. Next, the regions the buried bitlines $BL_1$, $BL_2$ can be filled with an appropriate dielectric material (forming an inter-dielectric layer, such as ILD-0).

Thereafter, in one embodiment, the wordlines WL can be formed. For example, a layer of polysilicon can be formed over the top dielectric layer 30 (or, optionally, over the already-existing gate electrode layer 32). The layer of polysilicon can be etched into the individual wordlines WL using a protective mask that is patterned using a photolithographic process. At this point, dielectric material, or a second inter-dielectric layer (e.g., ILD-1), can optionally be formed between wordlines WL.

Thereafter, any additional processing to complete formation of the memory device 10 can be carried out. Such processing can include formation of bitline and/or wordline contacts, any additional dielectric layers, conductive layers, interconnect layers and so forth using conventional techniques.

As should be apparent, the foregoing method can be modified as desired to form desired properties of the memory device 10. For instance, the order of steps can be modified, certain steps can be omitted and/or additional steps can be added. In addition, the specified materials, doping parameters and so forth can be modified.

Although particular embodiments of the invention have been described in detail, it is understood that the invention is not limited correspondingly in scope, but includes all changes, modifications and equivalents coming within the spirit and terms of the claims appended hereto

What is claimed is:

1. A memory device comprising:
   a semiconductor substrate;
   a source and a drain formed from buried bitlines disposed within the semiconductor substrate, said source and drain defining a body region therebetween;

a bottom dielectric layer formed over the semiconductor substrate, said bottom dielectric layer having a thickness;

a charge storing layer formed over the bottom dielectric layer, said charge storing layer having a conductivity such that at least a first charge can be stored in a first charge storing cell adjacent the drain and at least a second charge can be stored in a second charge storing cell adjacent the source;

a top dielectric layer formed over the charge storing layer, said top dielectric having a thickness less than the thickness of the bottom dielectric layer; and a gate electrode formed over the top dielectric layer.

2. The memory device according to claim 1, wherein the top dielectric layer is effective to increase the probability that, during an erase operation, electrons within the charge storing layer will directly tunnel through the top dielectric layer to exit the charge storing layer into the gate electrode.

3. The memory device according to claim 2, wherein the bottom dielectric layer is effective to decrease the probability that electrons will overcome a potential barrier of the bottom dielectric layer and escape from the charge storing layer into the substrate.

4. The memory device according to claim 1, wherein the top dielectric layer has a thickness of about 25 angstroms (Å) to less than about 50 angstroms (Å).

5. A memory device comprising:

a semiconductor substrate;

a source and a drain formed from buried bitlines disposed within the semiconductor substrate, said source and drain defining a body region therebetween;

a bottom dielectric layer formed over the semiconductor substrate, said bottom dielectric layer having a thickness;

a charge storing layer formed over the bottom dielectric layer, said charge storing charge storing cell adjacent the drain and at least a second charge cane stored in a second charge storing cell adjacent the source;

a top dielectric layer formed over the charge storing layer, said top dielectric having a thickness of about 25 angstroms (Å) to about 50 angstroms (Å) which is less than the thickness of the bottom dielectric layer; and a gate electrode formed over the top dielectric layer.

6. The memory device according to claim 5, wherein the bottom dielectric layer has a thickness of about 50 angstroms (Å) to about 80 angstroms (Å).

7. The memory device according to claim 5, wherein the charge storing layer has a thickness of about 50 angstroms (Å) to about 80 angstroms (Å).

8. The memory device according to claim 5, wherein the bottom dielectric layer, the top dielectric layer and the charge storing layer form a dielectric stack having a thickness of about 130 angstroms (Å) to about 190 angstroms (Å).

9. A method of performing an erase operation on a non-volatile memory device having a source and a drain within a substrate, a bottom dielectric layer formed over a top surface of the substrate, a charge storing dielectric layer formed over the bottom dielectric layer, a top dielectric layer formed over the charge storing dielectric layer, and a gate electrode formed over the top dielectric layer, the memory device having been programmed by storing charge in a portion of the charge storing layer adjacent the drain, the method comprising the simultaneous steps of:

applying a positive erase voltage of about +4 Volts to about +5 Volts to the gate electrode; and connecting at least one of the drain or the source to a potential of about −4 Volts to about −5 Volts.

10. The method according to claim 9, wherein the charge storing dielectric layer includes two bits, both bits being erased simultaneously.

11. The method according to claim 9, further comprising:

applying a potential of about +4 Volts to about +5 Volts to the gate electrode; connecting the drain to a potential of about −4 Volts to about −5 Volts; and grounding the source.

12. The method according to claim 9, wherein the simultaneous steps occur for a duration of at least about 1 ms.

13. A method of simultaneously erasing at least two charge storing cells on a non-volatile memory device having a pair of bitlines within a substrate, a charge trapping dielectric stack on a top surface of the substrate, said charge trapping dielectric stack including a bottom dielectric layer, a charge storing dielectric layer end a top dielectric layer, said charge storing cells being disposed within the charge storing layer of the charge trapping dielectric stack, and a gate layer on the charge storing dielectric stack, said method comprising:

decreasing the thickness of the top dielectric layer of the dielectric stack, said decreased thickness being effective to increase the probability that, during an erase operation, electrons within the charge storing cells of the charge storing layer will directly tunnel through the top dielectric layer to exit the charge storing cells;

applying a positive gate erase voltage of less than about +10 Volts to the gate layer;

one of (i) applying a zero potential to a first bitline and a second bitline, or (ii) applying a potential of about −4 Volts to about −5 Volts to the first bitline and the second bitline.

14. The method according to claim 13, further comprising:

setting a potential barrier height of the bottom dielectric layer of the charge trapping dielectric stack such that the potential barrier height is effective to decrease the probability that, during an erase operation, electrons within the charge storing layer will overcome a potential barrier of the bottom dielectric layer and tunnel through the bottom dielectric layer.

15. The method according to claim 14, further comprising:

reducing a thickness of the bottom dielectric layer, while maintaining the retention properties of the cell.

16. The method according to claim 13, further including:

facilitating direct tunneling from the charge storing dielectric layer into the gate layer by decreasing the thickness of the top dielectric layer to between about 25 angstroms (Å) and about 50 angstroms (Å).

* * * * *

UNITED STATES PATENT AND TRADEMARK OFFICE
CERTIFICATE OF CORRECTION

PATENT NO. : 6,862,221 B1
DATED : March 1, 2005
INVENTOR(S) : Melik-Martirosian et al.

It is certified that error appears in the above-identified patent and that said Letters Patent is hereby corrected as shown below:

Column 6,
Line 35, replace "+4" with -- -4 --.

Column 8,
Line 33, after "regions" insert -- above --.

Column 9,
Line 10, after "storing" insert -- layer having a conductivity such that at least a first charge can be stored in a first --.
Line 11, replace "cane" with -- can be --.

Signed and Sealed this

Seventeenth Day of May, 2005

JON W. DUDAS
*Director of the United States Patent and Trademark Office*